United States Patent [19]
Garrity et al.

[11] Patent Number: 5,574,457
[45] Date of Patent: Nov. 12, 1996

[54] SWITCHED CAPACITOR GAIN STAGE

[75] Inventors: Douglas A. Garrity, Gilbert, Ariz.;
Patrick L. Rakers, Schaumburg, Ill.

[73] Assignee: Motorola, Inc., Schaumburg, Ill.

[21] Appl. No.: 489,349

[22] Filed: Jun. 12, 1995

[51] Int. Cl.$^6$ ........................................................ H03M 1/12
[52] U.S. Cl. ............................ 341/172; 341/156; 341/155
[58] Field of Search ...................................... 341/133, 155,
341/158, 159, 160, 161, 162, 172

[56] References Cited

U.S. PATENT DOCUMENTS

| | | | |
|---|---|---|---|
| 3,820,112 | 6/1974 | Roth | 341/899 |
| 4,745,394 | 5/1988 | Cornett | 341/118 |
| 4,806,874 | 2/1989 | Michel | 330/9 |
| 4,893,124 | 1/1990 | Tsuji et al. | 341/156 |
| 4,988,952 | 1/1991 | Sevastopoulos et al. | 330/51 |
| 5,030,954 | 7/1991 | Ribner | 341/172 |
| 5,274,377 | 12/1993 | Matsuura et al. | 341/161 |
| 5,392,043 | 2/1995 | Ribner | 341/143 |

OTHER PUBLICATIONS

"A 12-bit 1-Msample/s Capacitor Error-Averaging Pipelined A/D Converter", by Authors Song, Tompsett and Lakshmikumar, Copyright 1988 IEEE Journal of Solid-State Circuits, vol. 23, No. 6, Dec. 1988, pp. 1324–1333.
"A Pipeland 13-bit, 250-ks/s, 5-V Analog-to-Digital Converter", by Authors Sutarja and Gray, Copyright 1988, IEEE Journal of Solid-State Circuits, vol. 23, No. 6, 1988, pp. 1316–1323.
"A 10 b, 20 Msample/s, 35 mW Pipeline A/D Converter" by Authors Cho and Gray, Copyright 1995, IEEE Journal of Solid-State Circuits, vol. 30, No. 3, Mar. 1995, pp. 166–172.
"A Second-Order Double-Sampled Delta-Sigma Modulator", by Authors Burmas, Lewis, Hurst and Dyer, Copyright 1995, IEEE 1995 Custom Integrated Circuits Conference, pp. 195–198.
"Considerations for High-Frequency Switched-Capacitor Ladder Filters", by Authors Choi and Brodersen, Copyright 1980, IEEE Transactions on Circuits and Systems, vol. Cas–27, No. 6, Jun. 1980, pp. 545–552.

*Primary Examiner*—Jeffrey A. Gaffin
*Assistant Examiner*—Jason L. W. Kost
*Attorney, Agent, or Firm*—Gary W. Hoshizaki

[57] ABSTRACT

A switched capacitor gain stage (21) that samples an input voltage every clock cycle phase for effectively doubling the frequency of operation. The switched capacitor gain stage (21) comprising an amplifier (22), a first capacitor network, and a second capacitor network. Either the first or second capacitor network is sampling an input voltage. For example, the first capacitor network samples an input voltage. Capacitors of the first capacitor network are coupled to sample the input voltage via switches. Capacitors of the second switched capacitor network are coupled around the amplifier (22) in a gain configuration via switches. The capacitors of the second switched capacitor network having a voltage stored from a previous clock phase. In a next clock phase the second switched capacitor network are coupled via switches for sampling an input voltage and the first switched capacitor network is coupled via switches in a gain configuration around the amplifier (22).

22 Claims, 4 Drawing Sheets

FIG. 1 —PRIOR ART—

SWITCHED CAPACITOR GAIN STAGE

BACKGROUND OF THE INVENTION

This invention relates, in general, to gain stages, and more particularly, to switched capacitor gain stages.

An amplifier typically has an input and an output. The amplifier amplifies a signal applied to the input and provides the amplified signal at the output. In general, amplifiers are characterized by the amount of gain or amplification provided, bandwidth or frequency of operation, noise characteristics, and accuracy of amplification. Amplifiers are commonly used in many different types of circuits, for example, Analog to Digital converters.

One type of amplifier is a switched capacitor amplifier. A switched capacitor amplifier is a clocked circuit that operates in discrete steps. For example, in a first phase of a clock cycle a voltage is sampled, in particular, capacitors of a switched capacitor amplification stage are charged to the voltage. Switches are used to couple the capacitors in different configurations. The switches are transmission gates formed from complementary transistor types. In a second phase of a clock cycle, the capacitors of the switched capacitor amplifier are coupled via switches around an amplifier in a configuration to amplify a sampled voltage. The voltages stored on the capacitors in the first phase of the clock cycle determine the magnitude of an output voltage of the amplification stage. The gain is typically fixed by the amplification stage configuration (in the second phase of the clock cycle) and the capacitor values.

In general, the operational speed of a switched capacitor amplifier stage is limited by the time needed to charge and discharge capacitors of the amplifier stage or the time required for an amplifier of the amplification stage to stabilize. For example, switched capacitor gain stages are used in pipelined Analog to Digital Converter (ADC) stages. The switched capacitor gain stages are used in a pipelined ADC to amplify an analog signal. An output of a switched capacitor gain stage in an ADC corresponds to a digital equivalent of an analog signal level. The speed or frequency at which an analog signal can be converted to a digital signal is directly related to the speed of the switched capacitor amplifier stages. An increase in the speed of switched capacitor amplifiers stages of an analog to digital converter can be used to enhance the frequency of operation.

It would be of great benefit if a switched capacitor amplification stage could be provided that decreases the time needed to amplify a signal.

DETAILED DESCRIPTION OF THE DRAWINGS

An amplifier is an essential component of an Analog to Digital Converter (ADC). One type of ADC that has a high resolution and fast sample rate is a pipelined ADC. A pipelined ADC employs a group of series coupled amplifier stages for generating a digital signal. An amplifier stage is susceptible to producing error due to capacitor mismatch, voltage offset of the amplifier, non-ideal switches, noise, finite amplifier gain, finite amplifier bandwidth, and device leakage. Any error produced by an amplifier stage degrades the performance of the ADC.

Figure 1:
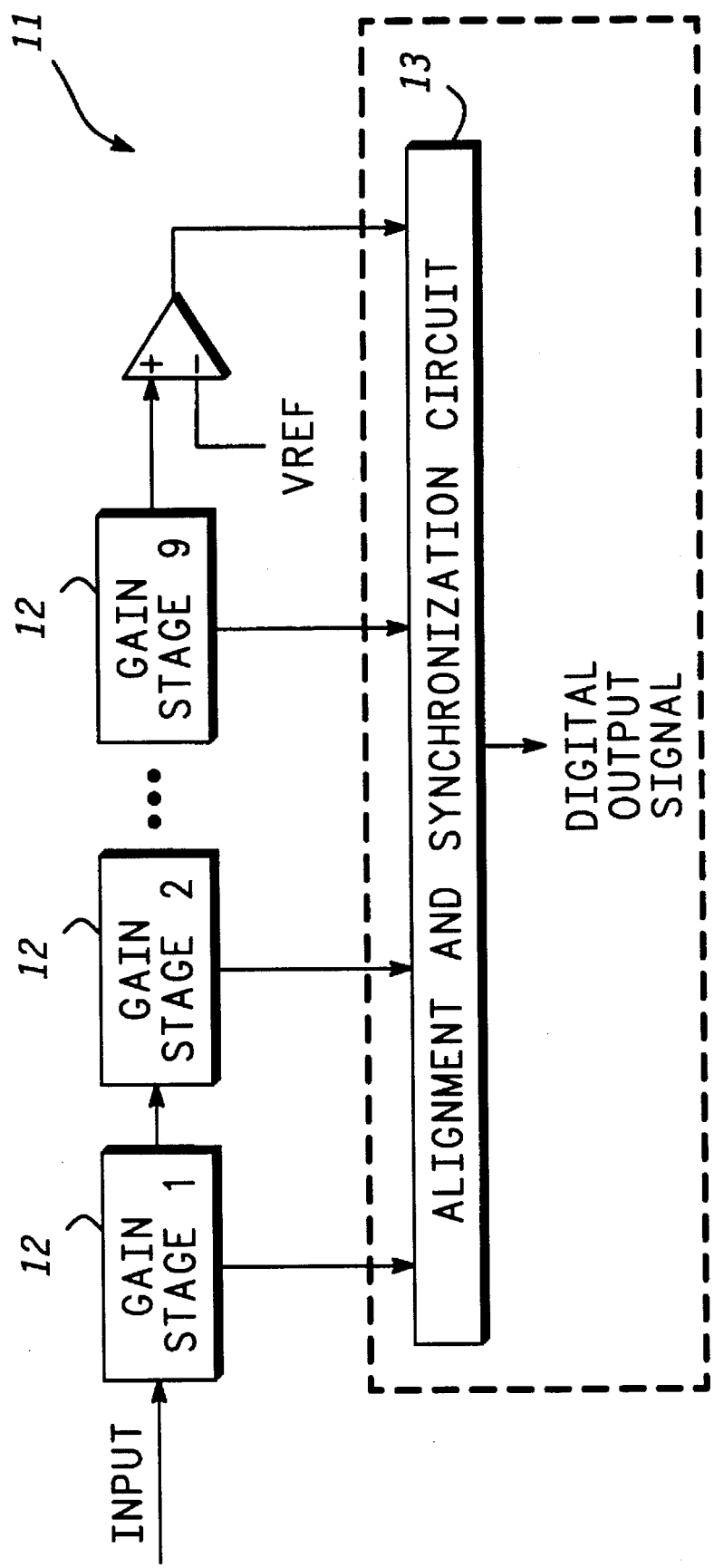
FIG. 1 is a block diagram of a pipelined analog to digital converter (ADC) illustrating a plurality of gain stages coupled in series.

FIG. 1 is a block diagram of a pipelined Analog to Digital Converter (ADC) 11. ADC 11 has an input for receiving an analog signal and an output for providing a digital output signal. Amplifier gain stages 12 are coupled in series, each generating a digital signal corresponding to a magnitude of the sampled analog signal. An alignment and synchronization circuit 13 coordinates the digital conversion process.

In general, a pipelined ADC samples an analog signal at a specified clock rate and generates a digital signal corresponding to a voltage magnitude of each sampled signal. The resolution or accuracy of a pipelined ADC is a function of the number of amplifier gain stages used. Each series coupled amplifier gain stage corresponds to a bit of resolution, starting with the Most Significant Bit (MSB) for a first stage of amplification and ending with the Least Significant Bit (LSB) for a last stage of amplification.

The speed of operation of ADC 11 is directly related to the speed of the series coupled amplifier gain stages 12. Each amplifier gain stage relies on the results of a preceding amplifier gain stage before generating a digital signal. An amplifier gain stage includes a switched capacitor gain stage and at least one comparator. A switched capacitor gain stage of an amplifier gain stage amplifies a voltage received by the amplifier gain stage which is coupled to an adjacent amplifier gain stage. A comparator of an amplifier gain stage compares the voltage received by the amplifier gain stage against a reference voltage and generates a corresponding logic level. The clock rate at which an input signal is sampled by ADC 11 is determined by the delay path through amplifier gain stages 12 and delay due to alignment and synchronization circuit 13. Accordingly, the clock rate could be increased if the operating speed of amplifier gain stages 12 is reduced.

In the preferred embodiment, amplifier gain stages 12 of pipelined ADC 11 have a gain of two. A reference voltage (Vref) is either added to or subtracted from an amplified voltage of a first amplifier gain stage (Gain Stage 1 of FIG. 1) depending on the comparison results. A logic level is also set based on the comparison results. A resulting output voltage (2*Vin+/−Vref) is then applied to a next amplification stage (Gain Stage 2 of FIG. 1) and the process is repeated such that the sample voltage is pipelined to determine the remaining digital bits sequentially as is well known.

The operation and architecture of different pipelined ADC circuits are described in "A 12-bit 1-Msample/s Capacitor Error-Averaging Pipelined A/D Converter" by Bang-Sup Song, Michael F. Tompsett, and Kadaba R. Lakshmikumar, in the IEEE Journal of Solid-State Circuits, VOL. 23, NO. 6, December 1988, "A Pipelined 13 bit, 250-ks/s, 5-V Analog to Digital Converter" by Sehat Sutarja and Paul R. Gray, in the IEEE Journal of Solid-State Circuits, VOL. 23, NO. 6, December 1988, and "A 10 b, 20 Msample/s, 35 mW Pipeline A/D Converter" by Thomas Byunghak Cho and Paul R. Gray, in the IEEE Journal of Solid-State Circuits, VOL. 30, NO. 33, March 1995 which are hereby incorporated by reference. Each of the pipelined ADC circuits listed hereinabove utilize a group of series coupled amplifier gain stages. The amplifiers stages described in the articles are switched capacitor amplifier stages that have similar characteristics. In particular, the switched capacitor amplifier stages are a clocked circuit. Capacitors of the switched capacitor circuit are charged during a first phase of a clock cycle. The capacitors are then coupled around an operational amplifier in a predetermined configuration during a second phase of the clock cycle.

The speed of operation of a switched capacitor amplifier stage is increased by a factor of two by utilizing an amplifier of the switched capacitor amplifier stage during the complete clock cycle instead of one half the clock cycle as stated above. Two groups or sets of capacitors are switched in and out to continuously amplify sampled signals.

Figure 2:
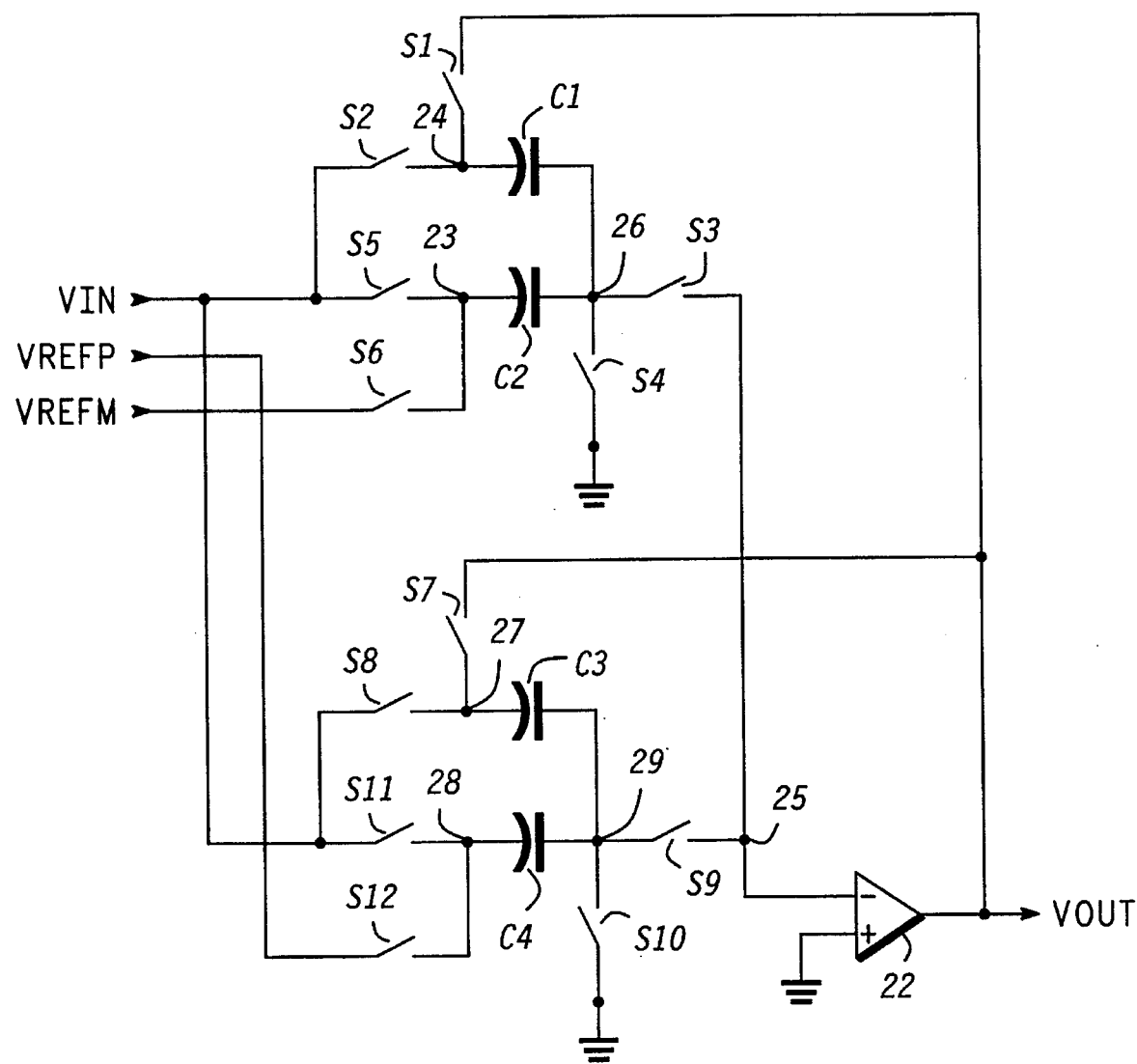
FIG. 2 is a schematic diagram of a switched capacitor gain stage in accordance with the present invention.

FIG. 2 is a schematic diagram illustrating a switched capacitor amplifier stage 21 in accordance with the present invention. Switched capacitor amplifier stage 21 comprises switches S1–S12, capacitors C1–C4 and an amplifier stage 22. Switches S1–S6 and capacitors C1 and C2 with amplifier 22 during one phase of a clock cycle. Switches S7–S12 operate with amplifier 22 during the other phase of the clock cycle.

Switched capacitor amplifier stage 21 has an input VIN, an input VREFP, an input VREFM, and an output VOUT. Inputs VREFM and VREFP are inputs for respectively subtracting a reference voltage from the amplified signal at VOUT of switched capacitor amplifier stage 21. Amplifier 22 has an inverting input coupled to a node 25, a non-inverting input coupled to a power supply terminal (e.g. ground), and an output coupled to the output VOUT. Switch S1 couples between output VOUT and a node 24. Switch S2 couples between input VIN and node 24. Switch S3 couples between a node 26 and a node 25. Switch S4 couples between node 26 and the power supply terminal (e.g. ground). Switch S5 couples between input VIN and a node 23. Switch S6 couples between input VREFM and node 23. Capacitor C1 couples between node 24 and node 26. Capacitor C2 couples between node 23 and node 26.

Switches S2, S5, and S4 couple capacitors C1 and C2 between the input VIN and ground. Switches S2, S5, and S4 allow capacitors C1 and C2 to charge to a voltage applied to VIN.

Switches S1 and S3 couple capacitor C1 between the inverting input and the output of amplifier 22. Switches S6 and S3 couple capacitor C2 between the input VREFM and the inverting input of amplifier 22. A reference voltage applied to VREFM is subtracted from an output voltage at the output VOUT when capacitors C1 and C2 are coupled around amplifier 22.

Switch S7 couples between a node 27 and the output VOUT. Switch S8 couples between the input VIN and node 27. Switch S9 couples between a node 29 and node 25. Switch S10 couples between node 29 and the power supply terminal (e.g. ground). Switch S11 couples between the input VIN and a node 28. Switch S12 couples between the input VREFP and node 28. Capacitor C3 couples between node 27 and node 29. Capacitor C4 couples between node 28 and node 29.

Switches S8, S10, and S11 couple capacitors C3 and C4 between the input VIN and ground. Switches S8, S10, and S11 allow capacitors C3 and C4 to charge to a voltage applied to VIN.

Switches S7 and S9 couple capacitor C3 between the inverting input and the output of amplifier 22. Switches S12 and S9 couple capacitor C4 between the input VREFP and the inverting input of amplifier 22. A reference voltage applied to VREFP is subtracted from an output voltage at the output VOUT when capacitors C3 and C4 are coupled around amplifier 22.

Figure 3:
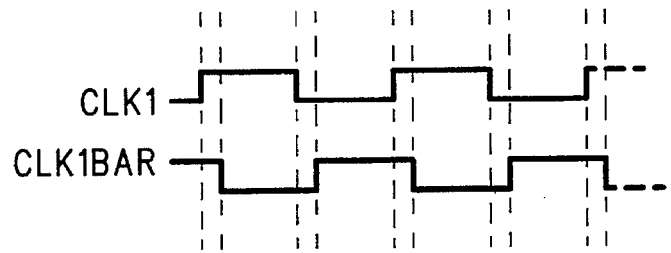
FIG. 3 is a timing diagram for the switched capacitor gain stage of FIG. 2 in accordance with the present invention.

FIG. 3 is a timing diagram illustrating clock signals for opening and closing switches S1–S12 of switched capacitor amplifier stage 21 of FIG. 2. A clock signal CLK1 and a clock signal CLK1BAR are used to enable and disable switches S1–S12. CLK1BAR is the complement of the clock signal CLK1. The rate of sampling is doubled by sampling and providing an output signal during either phase of the clock signal CLK1. Double sampling makes an effective clock rate of switched capacitor amplifier stage 21 of FIG. 2 equal to twice the frequency of clock signal CLK1 since an output signal is provided during each clock phase. In the preferred embodiment, the clock signals CLK1 and CLK1BAR are non-overlapping.

Figure 4:
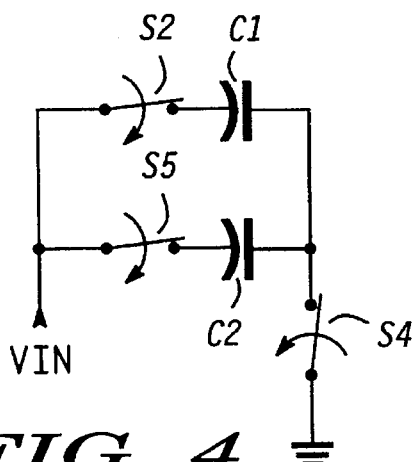
FIG. 4 is a schematic diagram illustrating sampling to capacitors C1 and C2.

FIG. 4 is a schematic diagram of capacitors C1 and C2 of switched capacitor amplifier stage 21 of FIG. 2 when the clock signal CLK1 of FIG. 3 is at a logic one level and the clock signal CLK1BAR of FIG. 3 is at a logic zero level. Capacitors C1 and C2 are in a sampling configuration. Switches S2, S4, and S5 are closed thereby coupling capacitors C1 and C2 between the input VIN and ground. A voltage applied to the input VIN charges capacitors C1 and C2. Note that charging capacitors C1 and C2 works independent of amplifier 22 of FIG. 2.

Figure 5:
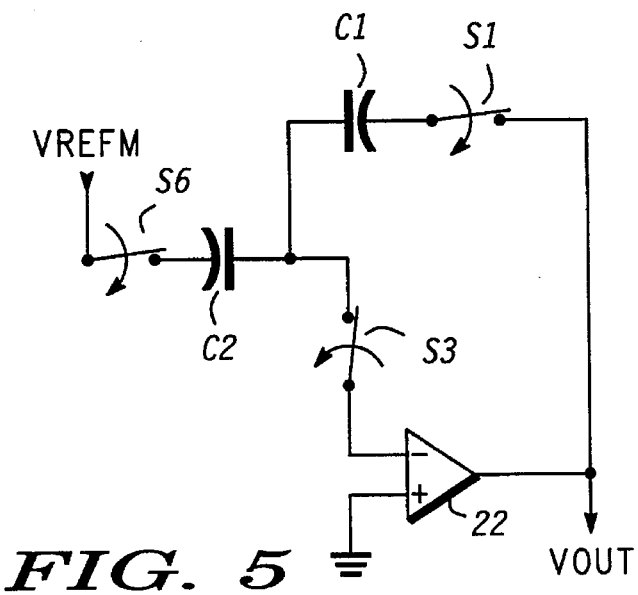
FIG. 5 is a schematic diagram illustrating capacitors C1 and C2 coupled in a gain configuration around an amplifier.

FIG. 5 is a schematic diagram of capacitors C1 and C2 in a gain configuration around switched capacitor amplifier stage 21 of FIG. 2 when the clock signal CLK1 of FIG. 3 is at a logic zero level and the clock signal CLK1BAR of FIG. 3 is at a logic one level. Switches S1, S3, and S6 are closed. Capacitor C1 is coupled between the inverting input and the output of amplifier 22. Capacitor C2 is coupled between the input VREFM and the inverting input of amplifier 22. In the preferred embodiment, capacitors C1 and C2 have an equal capacitance which configures the amplifier stage in a gain of two. A reference voltage applied to VREFM subtracts from an amplified voltage of a sampled voltage on capacitors C1 and C2. Thus, the amplifier stage shown in FIG. 5 multiplies the voltage sampled in FIG. 4 on capacitors C1 and C2 by a factor of two and subtracts out the reference voltage applied to VREFM.

Figure 6:
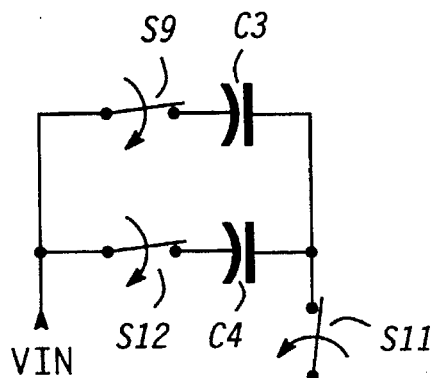
FIG. 6 is a schematic diagram illustrating sampling to capacitors C3 and C4.

FIG. 6 is a schematic diagram of capacitors C3 and C4 of switched capacitor amplifier stage 21 of FIG. 2 when the clock signal CLK1 of FIG. 3 is at a logic zero level and the clock signal CLK1BAR of FIG. 3 is at a logic one level. Capacitors C3 and C4 are in a sampling configuration. Switches S8, S10, and S11 are closed thereby coupling capacitors C3 and C4 between the input VIN and ground. A voltage applied to the input VIN charges capacitors C3 and C4. Note that charging capacitors C3 and C4 works independent of amplifier 22 of FIG. 2. Capacitors C3 and C4 are being charged when capacitors C1 and C2 of FIG. 2 are in a gain configuration around amplifier 22 of FIG. 2.

Figure 7:
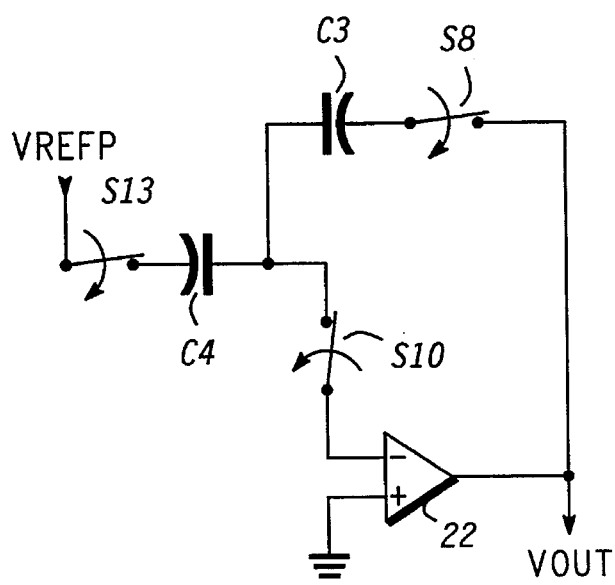
FIG. 7 is a schematic diagram illustrating capacitors C3 and C4 coupled in a gain configuration around an amplifier.

FIG. 7 is a schematic diagram of capacitors C3 and C4 in a gain configuration around switched capacitor amplifier stage 21 of FIG. 2 when the clock signal CLK1 of FIG. 3 is at a logic one level and the clock signal CLK1BAR of FIG. 3 is at a logic zero level. Switches S7, S9, and S12 are closed. Capacitor C3 is coupled between the inverting input and the output of amplifier 22 of FIG. 2. Capacitor C4 is coupled between the input VREFP and the inverting input of amplifier 22. In the preferred embodiment, capacitors C3 and C4 have an equal capacitance which configures the amplifier stage in a gain of two. A reference voltage applied to VREFP subtracts from an amplified voltage of a sampled voltage on capacitors C3 and C4. Thus, the switched capacitor amplifier stage shown in FIG. 7 multiplies the voltage sampled in FIG. 6 on capacitors C3 and C4 by a factor of two and subtracts out the reference voltage applied to VREFP. Capacitors C1 and C2 of FIG. 2 are being charged when capacitors C3 and C4 are in a gain configuration around amplifier 22.

Referring back to FIG. 3, a valid output signal is provided by switched capacitor amplifier stage 21 of FIG. 2 at each transition of clock signal CLK1. Switched capacitor amplifier stage 21 provides an output signal at twice the rate of prior art amplifier stages that sample during a first phase of a clock signal and amplify during a second phase of the clock signal. Additional capacitors are added for sampling during both clock phases of a clock signal. Prior art amplifier stages have a dead period during a clock half cycle when capacitors of an amplifier stage are charged and the amplifier is not used. Performance of an amplifier is degraded if it is continuously turned on and off with each half cycle due to the extra time required for the amplifier to stabilize to a quiescent state. Prior art amplifier stages eliminate this problem by adding dummy switches and capacitors to provide feedback to the amplifier during the portion of the clock cycle that the amplifier is not used. The circuit shown in FIG. 2 does not have the problem of a period when the amplifier is not used since amplifier 22 of FIG. 2 is operated continuously during a clock cycle. No dummy switches and capacitors which increase the area of the circuit are needed. The only break in operation is when one group of capacitors is being decoupled from an amplifier for sampling a voltage and the other group of capacitors is being coupled in a gain configuration around the amplifier or vice versa.

Switched capacitor amplifier stage 22 of FIG. 2 reduces power reduction by a factor of two when operated at similar speeds as the prior art amplifier stages described hereinabove. Switched capacitor amplifier stage 22 can operate at one half the frequency of a single sampling amplifier stage, thus it will dissipate one half the power. Also, amplifier loading is close to prior art amplifier stages.

Figure 8:
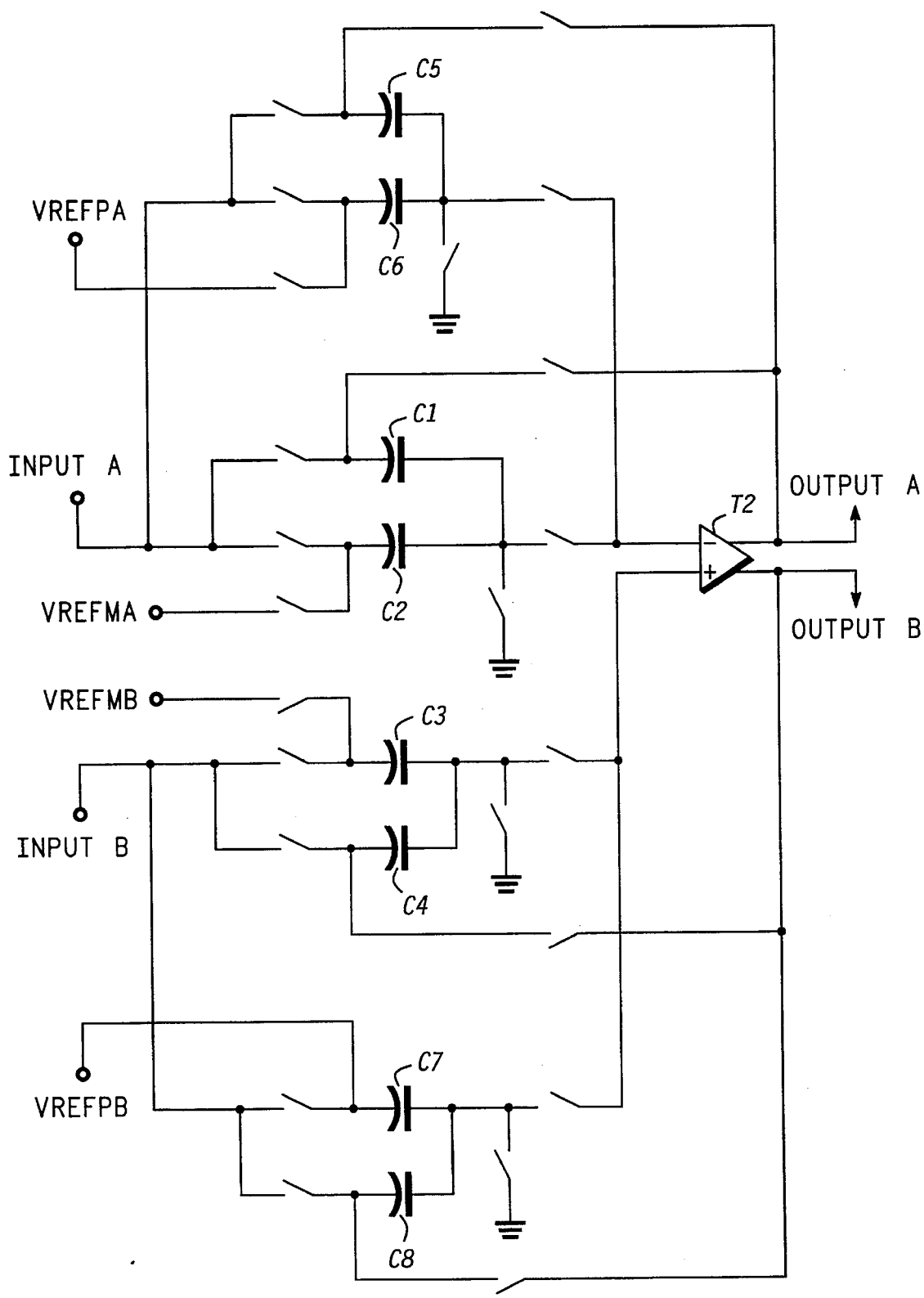
FIG. 8 is a schematic diagram illustrating a fully differential version of the switched capacitor gain stage of FIG. 2.

FIG. 8 is a switched capacitor amplifier stage 71 in a fully differential configuration corresponding to the switched capacitor amplifier stage 21 of FIG. 2. A fully differential configuration of an amplifier stage is beneficial for the rejection of noise that is common to both inputs and doubles the achievable dynamic range. Switched capacitor amplifier stage 71 has an input A, an input B, an input VREFMA, an input VREFMB, an input VREFPA, an input VREFPB, an output A, and an output B. Operation of switched capacitor amplifier stage 71 is similar to that described for switched capacitor amplifier stage 21 of FIG. 2. A difference is that the capacitors and switches coupled around the inverting input of amplifier 22 of FIG. 2 is duplicated for the non-inverting input of switched capacitor amplifier stage 71.

Capacitors C1–C4 and switches coupled thereto correspond to a first sampling circuit for an amplifier 72. Capacitors C1 and C2 receive a voltage from input A. Capacitors C3 and C4 receive a voltage from input B. The voltage difference between inputs A and B are amplified by an amplifier 72. Capacitors C5–C8 and switches coupled thereto correspond to a second sampling circuit for amplifier 72. Capacitors C5 and C6 receive a voltage from input A. Capacitors C7 and C8 receive a voltage at input B. Capacitors C1–C4 are charged to a voltage (between inputs A and B, and ground) during a first clock phase while capacitors C5–C8 are coupled around amplifier 72 in a gain configuration similar to that shown in FIGS. 5 and 6. A differential reference voltage is applied across inputs VREFPA and VREFPB. During a second clock phase, capacitors C5–C8 are charged to a voltage (between inputs A and B, and ground) while capacitors C1–C4 are coupled around amplifier 72 in a gain configuration. A differential reference voltage is applied across inputs VREFMA and VREFMB. Amplifier 72 is operated throughout the clock cycle due to the double sampling process. Although more circuitry is required the fully differential switched capacitor amplifier stage 71 has increased performance characteristics for some applications and operates at increased speed or reduced power.

By now it should be appreciated that a switched capacitor amplifier stage has been provided that increases operating speed or reduces power dissipation. The amplifier stage samples an input voltage during both clock phases of a clock cycle. The sampling process is independent from an amplification process thereby allowing the amplification of a previously sampled signal concurrent with another input sampling. The amplifier is always operating thereby not requiring dummy feedback circuitry used in prior art amplifier stages. The amplifier significantly improves the performance of a pipelined ADC that utilizes multiple gain stages in series.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A switched capacitor gain stage having an input and an output, the switched capacitor gain stage comprising:

an amplifier having an inverting input, a non-inverting input coupled to a power supply terminal, and an output coupled to the output of the switched capacitor gain stage;

a first capacitor having a first terminal and a second terminal;

a first switch having a first terminal coupled to said first terminal of said first capacitor and a second terminal coupled to said output of said amplifier;

a second switch having a first terminal coupled to the input of the switched capacitor gain stage and a second terminal coupled said first terminal of said first capacitor;

a third switch having a first terminal coupled to said second terminal of said first capacitor and a second terminal coupled to said inverting input of said amplifier;

a fourth switch having a first terminal coupled to said second terminal of said first capacitor and a second terminal coupled to said power supply terminal;

a fifth switch having a first terminal coupled to the input of the switched capacitor gain stage and a second terminal;

a second capacitor having a first terminal coupled to said second terminal of said fifth switch and a second terminal coupled to said second terminal of said first capacitor;

a third capacitor having a first terminal and a second terminal;

a sixth switch having a first terminal coupled to said first terminal of said third capacitor and a second terminal coupled to said output of said amplifier;

a seventh switch having a first terminal coupled to the input of the switched capacitor gain stage and a second terminal coupled said first terminal of said third capacitor;

an eighth switch having a first terminal coupled to said second terminal of said third capacitor and a second terminal coupled to said inverting input of said amplifier;

a ninth switch having a first terminal coupled to said second terminal of said third capacitor and a second terminal coupled to said power supply terminal;

a tenth switch having a first terminal coupled to the input of the switched capacitor gain stage and a second terminal; and a fourth capacitor having a first terminal coupled to said second terminal of said tenth switch and a second terminal coupled to said second terminal of said third capacitor.

2. The switched capacitor gain stage as recited in claim 1 further including an eleventh switch having a first terminal coupled to a first reference input and a second terminal coupled to said first terminal of said second capacitor.

3. The switched capacitor gain stage as recited in claim 2 further including a twelfth switch having a first terminal coupled to a second reference input and a second terminal coupled to said first terminal of said fourth capacitor.

4. The switched capacitor gain stage as recited in claim 3 wherein said second, fourth, and fifth switches are closed during a first phase of a clock cycle for sampling a voltage on said first and second capacitors corresponding to a voltage of an applied signal to the input of the switched capacitor gain stage.

5. The switched capacitor gain stage as recited in claim 4 wherein said first, third, and eleventh switches are closed during a second phase of said clock cycle for placing said first and second capacitors in a gain configuration around said amplifier.

6. The switched capacitor gain stage as recited in claim 5 wherein said amplifier amplifies said voltage on said first and second capacitors during said second phase of said clock cycle and wherein a reference voltage is applied to said first reference input.

7. The switched capacitor gain stage as recited in claim 3 wherein said seventh, ninth, and tenth switches are closed during a second phase of a clock cycle for sampling a voltage on said third and fourth capacitors corresponding to said voltage of an applied signal to the input of the switched capacitor gain stage.

8. The switched capacitor gain stage as recited in claim 7 wherein said sixth, eighth, and twelfth switches are closed during a first phase of said clock cycle for placing said third and fourth capacitors in a gain configuration around said amplifier.

9. The switched capacitor gain stage as recited in claim 8 wherein said amplifier amplifies a voltage stored on said third and fourth capacitors during a first phase of said clock cycle and wherein a reference voltage is applied to said second reference input.

10. The switched capacitor gain stage as recited in claim 3 wherein said first and second capacitors, and said third and fourth capacitors are coupled to said amplifier respectively during a second and a first phase of a clock cycle for increasing speed of operation and for maintaining said amplifier in a gain configuration throughout said clock cycle.

11. A clocked gain stage having an input and an output comprising:

an amplifier having an inverting input, a non-inverting input coupled to a power supply terminal, and an output coupled to the output of the clocked gain stage;

a first capacitor;

a second capacitor, said first and second capacitor being coupled between the input of the clocked gain stage and said power supply terminal during a first phase of a clock cycle for sampling a voltage of an input signal applied to the input of the clocked gain stage and said first and second capacitor being coupled in a gain configuration around said amplifier during a second phase of said clock cycle for amplifying a voltage sampled during said first phase of said clock cycle;

a third capacitor; and a fourth capacitor, said third and fourth capacitor being coupled between the input of the clocked gain stage and said power supply terminal during said second phase of said clock cycle for sampling a voltage of said input signal applied to the input of the clocked gain stage and said third and fourth capacitors being coupled in a gain configuration around said amplifier during a first phase of a clock cycle for amplifying a voltage sampled during a second phase of a previous clock cycle.

12. The clocked gain stage as recited in claim 11 wherein either said first and second capacitor or said third and fourth capacitor are coupled around said amplifier for maintaining said amplifier in a gain configuration during an entire clock cycle.

13. The clocked gain stage as recited in claim 11 wherein said first capacitor is coupled between said inverting input and said output of said amplifier during said second phase of said clock cycle and said second capacitor is coupled between a first reference input and said inverting input of said amplifier during said second phase of said clock cycle.

14. The clocked gain stage as recited in claim 13 wherein a reference voltage is applied to said first reference input.

15. The clocked gain stage as recited in claim 11 wherein said third capacitor is coupled between said inverting input and said output of said amplifier during said first phase of said clock cycle and said fourth capacitor is coupled between a second reference input and said inverting input of said amplifier during said first phase of said clock cycle.

16. The clocked gain stage as recited in claim 15 wherein a reference voltage is applied to said second reference input.

17. A pipelined Analog to Digital Converter (ADC) including a plurality of series coupled switched capacitor gain stages, the pipelined ADC wherein at least one switched capacitor gain stage of said plurality of series coupled switched capacitor gain stages samples and amplifies a voltage during both clock phases of a clock signal for increasing an operating speed of the pipelined ADC.

18. The pipelined ADC as recited in claim 17 wherein said at least one switched capacitor gain stage includes an input and an output and said at least one switched capacitor gain stage comprises:

an amplifier having an inverting input, a non-inverting input coupled to a power supply terminal, and an output;

a first capacitor;

a second capacitor, said first and second capacitor being coupled between said input of said at least one switched capacitor gain stage and a power supply terminal during a first phase of a clock cycle and said first and second capacitor being coupled in a gain configuration around said amplifier during a second phase of said clock cycle;

a third capacitor; and a fourth capacitor, said third and fourth capacitor being coupled between said input of said at least one switched capacitor gain stage and said power supply terminal during said second phase of said clock cycle and said third and fourth capacitors being coupled in a gain configuration around said amplifier during a first phase of a clock cycle.

19. The pipelined ADC as recited in claim 18 wherein during said second phase of said clock cycle said first capacitor is coupled between said inverting input and said output of said amplifier, said second capacitor is coupled between a first reference input and said inverting input of said amplifier, and a first reference voltage is applied to said first reference input.

20. The pipelined ADC as recited in claim 19 wherein said first and second capacitors have equal capacitance thereby placing said at least one switched capacitor gain stage in a gain of two during said second phase of said clock cycle.

21. The pipelined ADC as recited in claim 18 wherein during said first phase of said clock cycle said third capacitor is coupled between said inverting input and said output of said amplifier, said fourth capacitor is coupled between a second reference input and said inverting input of said amplifier, and a second reference voltage is applied to said second reference input.

22. The pipelined ADC as recited in claim 21 wherein said third and fourth capacitors have equal capacitance thereby placing said at least one switched capacitor gain stage in a gain of two during said first phase of said clock cycle.

* * * * *